United States Patent [19]
Condon

[11] 3,956,700
[45] May 11, 1976

[54] TWO-FEEDBACK-PATH DELTA MODULATION SYSTEM WITH CIRCUITS FOR REDUCING PULSE WIDTH MODULATION

[75] Inventor: Joseph Henry Condon, Summit, N.J.

[73] Assignee: Bell Telephone Laboratories, Incorporated, Murray Hill, N.J.

[22] Filed: Apr. 18, 1975

[21] Appl. No.: 569,160

[52] U.S. Cl. ............................ 325/38 B; 330/30 D; 332/11 D
[51] Int. Cl.² ........................................ H03K 13/22
[58] Field of Search ................. 330/16, 14, 21, 109, 330/151, 98, 99, 100; 340/347 DA; 235/154; 178/68, 88; 179/15 AP; 307/291; 328/27, 109, 110; 329/104; 325/38 B

[56] References Cited
UNITED STATES PATENTS

| | | | |
|---|---|---|---|
| 3,173,092 | 3/1965 | Meschi | 325/38 B |
| 3,543,264 | 11/1970 | Carbrey | 340/347 DA |
| 3,564,535 | 2/1971 | Ward et al. | 340/347 DA |
| 3,587,087 | 6/1971 | King | 340/347 |
| 3,624,558 | 11/1971 | Brolin | 332/11 D |
| 3,628,148 | 12/1971 | Brolin | 325/38 B |
| 3,646,545 | 2/1972 | Naydan et al. | 340/347 DA |
| 3,742,138 | 6/1973 | Cutler | 178/68 |
| 3,746,990 | 7/1973 | LeDiberder | 325/38 B |
| 3,761,841 | 9/1973 | Jacquart | 332/11 D |
| 3,775,705 | 11/1973 | Dolby | 333/14 |
| 3,792,352 | 2/1974 | Metcalf et al. | 324/99 D |
| 3,855,555 | 12/1974 | Burkhard | 332/11 D |
| 3,899,754 | 8/1975 | Brolin | 325/38 B |

OTHER PUBLICATIONS

Electronics, Apr. 4, 1974, p. 120.
Bell System Technical Journal, M—J, 1969, pp. 1459–1479.

*Primary Examiner*—Benedict V. Safourek
*Attorney, Agent, or Firm*—C. S. Phelan

[57] ABSTRACT

An analog input signal to a delta modulation coder is differentiated prior to being combined in an integrator with the output of a precise first negative feedback circuit to produce an error signal. An amplified and integrated form of the error signal is combined in a resistive-capacitive crossover circuit with the output of a fast, but coarsely integrating, negative feedback circuit to overcome delay in the response of the first-mentioned, i.e., slow, feedback circuit. The crossover circuit output is applied to a low gain comparator having a ground reference and used to drive a first clocked threshold circuit for producing a digital signal representation. A $\bar{Q}$ output of the latter circuit drives the fast feedback path; and a Q output controls a further clocked threshold circuit which drives the slow feedback path, as well as providing a retimed delta modulated output signal train. A delta modulation decoder which is compatible with the described coder is also shown.

19 Claims, 4 Drawing Figures

TWO-FEEDBACK-PATH DELTA MODULATION SYSTEM WITH CIRCUITS FOR REDUCING PULSE WIDTH MODULATION

BACKGROUND OF THE INVENTION

1. Field of the Invention

This invention relates to delta modulation systems; and it relates, in particular, to a compatible coder and decoder for translating between analog and delta signal formats.

2. Description of the Prior Art

Continuing studies of delta modulation systems center on coders and compatible decoders. Interest is based upon a trend toward expanded use of digital signals in communication systems. Such use makes it desirable to devise coders and decoders that are sufficiently simple to warrant, from both a cost and a signal quality standpoint, their use on a per line basis as distinguished from more limited applications which could be time shared by plural lines and thereby support the high cost of many prior art coding arrangements.

Significant deterrents to low cost, good quality coders have been the need for fast and precise response to analog signal variations in voice and video communication systems. It has also been desirable to produce such response without having the circuits become electrically unstable and break into intermittent or substained oscillations.

Delta modulation coders typically compare an analog input signal in one sampling time with an approximation of a sample of the same signal from a prior sampling time. The coder produces a pulse or no pulse depending upon whether the input analog signal is smaller or larger than the approximated analog signal. The resulting pulse train is the delta modulation signal representing the analog input signal. Various techniques, such as the adaptation of the feedback signal step size to the rate of input analog signal variation, have been employed to avoid problems of slope overload, i.e., the inability of the digital coder to track a rapidly changing analog signal without generating problems of distortion. However, such techniques are often rather costly.

Another important consideration is that the delta pulse train is often produced by a bistable circuit, such as a clocked D-type bistable circuit which is actuated by comparison circuit outputs. However, if the comparator circuit output level is close to the threshold level of the bistable circuit at the actuation time there is an ambiguity in the response time of the bistable circuit that results in width modulation of the bistable circuit output pulses. That modulation is integrated as distortion in the coder feedback and in a receiving demodulator, and the resulting noise makes a soft talker hard to understand.

SUMMARY OF THE INVENTION

The difficulties of the prior art are alleviated in many respects in accordance with an illustrative embodiment of the invention in which a delta modulator is provided with a circuit for retiming its possibly width modulated output. Also, fast and slow feedback paths driven separately by the unretimed and retimed outputs, respectively, are coupled through a frequency crossover impedance network to the input of circuits which determine the nature of the unretimed output. Integrating characteristics of the two feedback paths and the crossover network combine to form a single integrating characteristic over the input analog signal band of interest and up to frequencies that are several times the clocking rate of the modulator output pulse train.

It is one feature of the invention that the crossover impedance network appears as a high pass filter to the fast feedback path and a low pass filter to the slow feedback path so that drifts or other deviations from design values have complementary effects on the responses of the two paths to maintain essentially the same combined signal response.

Another feature is that distortion often caused by the use of bistable circuits driven close to the triggering decision threshold of the circuit is eliminated by retiming the delta modulation signal through the use of cascaded threshold circuits for driving the two feedback paths, respectively, and by the employment of a time constant in the crossover circuit which is relatively long compared to the time delay introduced by the second bistable threshold circuit.

An additional feature of the invention is that a compatible decoder includes two parallel signal paths driven by complementary outputs, respectively, of a bistable circuit that is operated by received delta modulation signals. Signals in the two paths cooperatively control an integrating operational amplifier for deriving the corresponding analog signal information.

BRIEF DESCRIPTION OF THE DRAWING

A more complte understanding of the invention and the various features, objects, and advantages thereof may be obtained from a consideration of the following detailed description in connection with the appended claims and the attached drawing in which:

DETAILED DESCRIPTION

Figure 1:
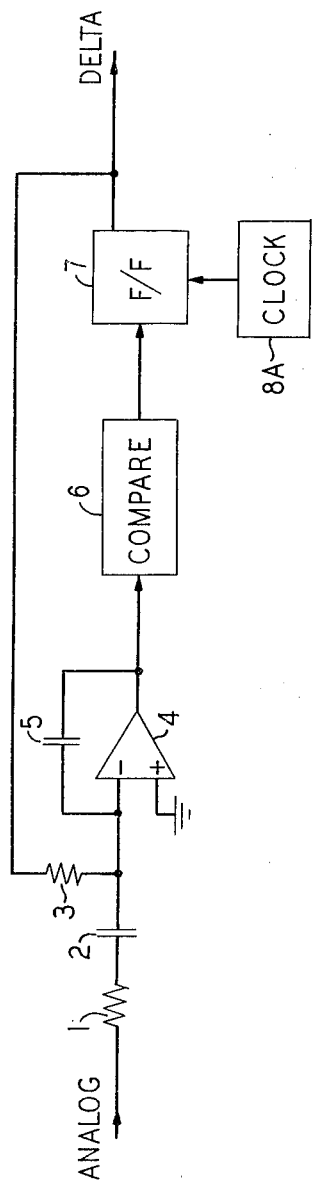
FIG. 1 is a diagram of a prior art coder.

FIG. 1 depicts in simplified fashion a prior art delta modulation type of coder in which an integrator is included in the forward signal path. Analog input signals are applied through a series resistor 1 and capacitor 2 to a circuit node at which the signal is combined with a signal fed back from the delta modulation coder output by way of negative feedback path including a resistor 3. Capacitor 2 cooperates with the near-zero input resistance of an amplifier 4, connected for integration, to differentiate the analog signal; and the difference, or error, signal between the digital differential type pulse code feedback and the differentiated analog input is immediately integrated by the operational amplifier 4 in cooperation with its feedback capacitor 5.

The integrated error signal is coupled through a comparator circuit 6 which compares the integrated error signal to a known reference, and the comparator 6 output drives a clocked bistable trigger circuit such as the flip-flop 7. Upon application of each clock pulse from a source 8A, the flip-flop 7 assumes one of its bistable states if the comparator output is above the triggering threshold and the other state if the comparator output is below the triggering threshold. The flip-flop circuit output is a pulse train of irregularly occurring pulses constituting the delta modulation signal. If the comparator output level is very close to the triggering threshold level at the time of a clock pulse, there are, as already noted, a delay in the triggering time and variations in the output pulse amplitude. Such pulse width and amplitude modulation in the delta modulation signal is hereinafter discussed, for convenience, in terms of only the width modulation; but the remedy discussed corrects both types at the same time. It is hereinafter shown how the present invention eliminates the width modulation effect while still maintaining useful stable operation that is free of double stepping.

Figure 2:
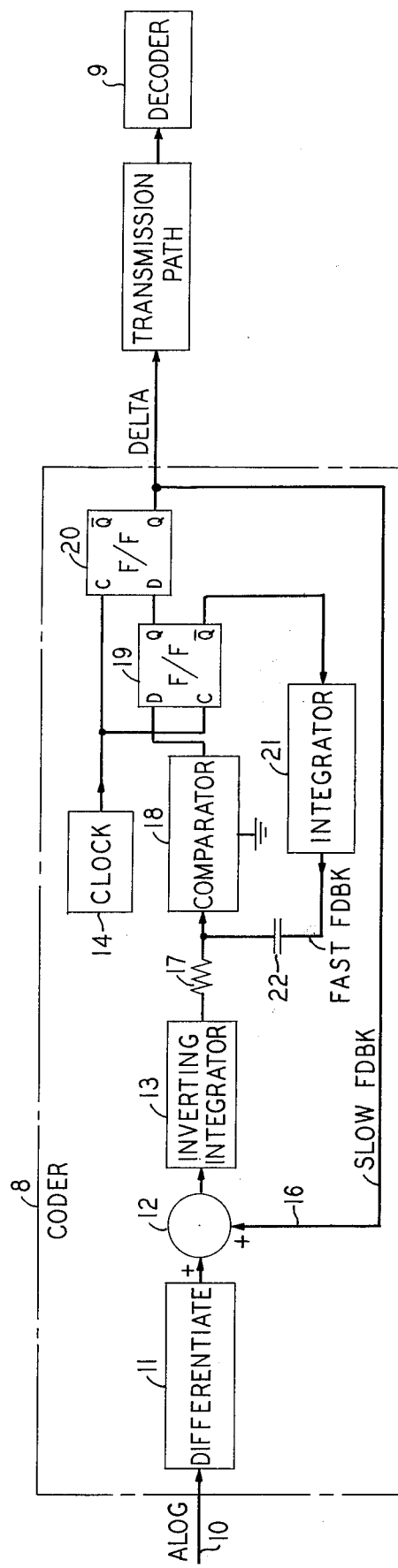
FIG. 2 is a simplified block and line diagram of a delta modulation system utlizing a coder in accordance with the invention.

In FIG. 2 there is shown in simplified form a delta modulation transmission system including one embodiment of a coder 8 employing the present invention. Output from coder 8 is transmitted through any suitable transmission path to a decoder 9. An incoming analog signal on a circuit path 10 is coupled through a differentiating circuit 11 and an analog adding circuit 12 to an input of an inverting integrator 13. Also applied to an input of the adding circuit 12 is a negative feedback signal coupled by way of a feedback path 16 from a digital output circuit of the coder.

The feedback path 16 is herein designated the slow feedback for reasons which will subsequently become apparent. The functions of the adding circuit 12 and the integrator 13 are intermingled in a way, which also will subsequently become apparent, so that the output of the integrator 13 is an analog error signal representing the difference between the analog input in the circuit path 10 and an approximation of that same analog signal from prior sampling intervals, as derived from the digital output of the coder through the slow feedback path 16. Error signal output of integrator 13 is coupled through a resistor 17 to a comparator 18 wherein the error is compared to a ground reference. An output of the comparator is coupled through a first bistable, trigger circuit such as a D-type bistable, or flip-flop, circuit 19 which is clocked at a frequency, the coder sampling rate, which is substantially higher than the highest frequency analog signals which are anticipated to be received in the analog circuit path 10. That sampling rate is selected to allow the delta modulator to track the fastest anticipated input analog signal changes. To this end, an 8 MHz clock has been advantageously employed for voice signals which are suitable for toll telephone communication.

Flip-flop circuit 19 is enabled by pulses from a clock signal source 14 to assume one of its two stable states corresponding to the binary state, with respect to the ground reference, of signals from comparator 18 each time a clock pulse is applied. Complimentary Q and $\bar{Q}$ outputs of flip-flop circuit 19 each indicate which state is current.

Flip-flop circuit 19 has a true, or Q, output that is applied for triggering a further D flip-flop circuit 20, of the same type. The circuit 20 has its Q output connected to the digital output circuit for the coder. In addition, the complementary, or $\bar{Q}$, output of the D flip-flop 19 is coupled through an integrating circuit 21 and a capacitor 22 to the aforementioned input of the compartor 18. The latter connection through integrator 21 comprises what is herein designated as a fast feedback path. The slow and fast feedback paths have nearly equal time constants and they take their respective designations primarily from the fact that the two paths are derived from outputs of different flip-flop circuits operating in cascade so that a signal which is coupled to the fast feedback path is necessarily one clock period ahead of the corresponding signal applied to the slow feedback path. Resistor 17 and capacitor 22 constitute a frequency crossover circuit for blending the signals produced by the slow and fast feedback paths. Comparator 18 is thus responsive to low frequency signals from integrator 13 and high frequency signals from integrator 21.

As previously noted, pulse width distortion is undesirable in delta modulation coders because it alters the output of analog integrating circuits used for decoding the digital signal. The second flip-flop circuit 20 is employed in FIG. 1 for regenerating the possibly width modulated delta modulation signal from circuit 19 under control of the clock signals in order to eliminate the pulse width modulation effect. Thus, an imprecise delta modulation signal is supplied from the $\bar{Q}$ output of flip-flop 19 to the fast feedback path, and a precise, i.e. retimed, signal is supplied from the Q output of flip-flop 20 to the slow path. It should be noted further that capacitor 22 blocks direct current feedback and thus does not allow accumulation of errors in the imprecise delta modulaton signal.

The delay through circuit 20 or the signal in the slow feedback path 16 tends, in the absence of the fast feedback path, to cause the coder to double step at low analog signal levels and thus be noisy. Such tendency is, however, essentially eliminated by the presence of the fast feedback path. In addition the time constant of the crossover circuit resistor 17 and capacitor 22 is made to be large as compared to the period of the clock signals which fix the coder sampling rate. Consequently, the rapid effects of the fast feedback path dominate the input to comparator 18 so that double stepping does not result.

It should be further noted in regard to the crossover circuit impedances that they are chosen in connection with the time constants of the slow and fast integrator feedback paths, so that the gain-versus-frequency response from the delta stream at the output of flip-flop 19 to the input of comparator 18 is substantially integrating over the full frequency band of interest for the coder. Such an integrating response is one which exhibits over the band of interest essentially linearly (on a log—log scale) decreasing gain with increasing frequency. That band extends from direct current through a frequency that is several times the coder sampling rate. Wide latitude of choice is possible in picking the crossover impedances; and, even if they vary due to temperature or other effects, the integrating response over the band of interest is retained.

In regard to the characteristics of the fast and slow feedback paths and the crossover impedances, they must be selected to allow these elements to cooperate for producing the mentioned integrating gain-versus-frequency response over the entire band of interest. To this end, the signal path from the output of flip-flop 19, through the slow path and integrator 13, to the input of comparator 18 advantageously has an integrating response that covers the low portion of the band up through at least a predetermined crossover frequency. Similarly, the path from the output of flip-flop 19 through th fast path and capacitor 22 to the input of comparator 18 advantageously has an integrating response that covers the high portion of the band including the crossover frequency and above. The crossover network impedances, resistor 17 and capacitor 22, are selected to include that crossover frequency and to maintain the overall integrating gain-versus-frequency response. Thus, the crossover network appears from the output of integrator 13 as a low pass filter, and it appears from the output of integrator 21 as a high pass filter.

Figure 3:
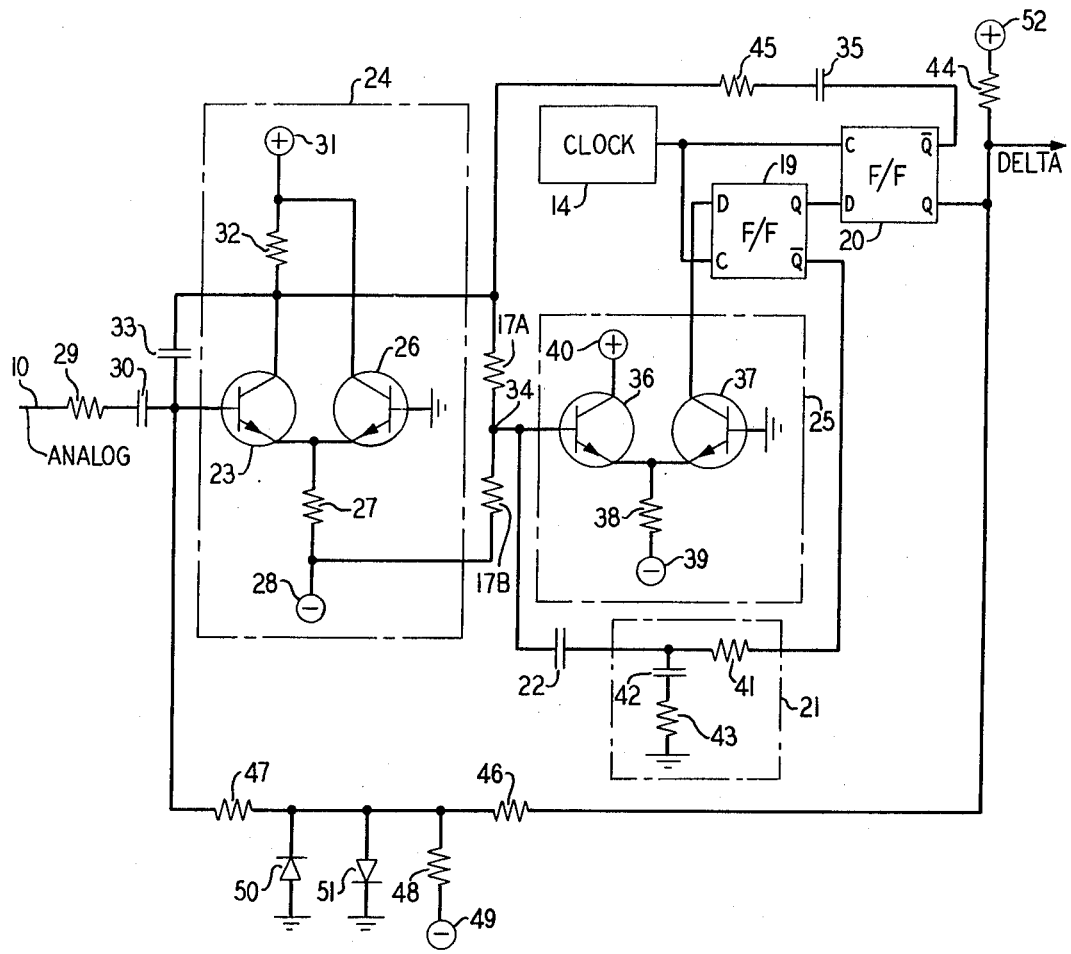
FIG. 3 is a schematic diagram of the coder in FIG. 2.

One schematic implementation of the coder of FIG. 2 is illustrated in FIG. 3. In that figure the functions of integrator 13 and comparator 18 are performed by a 2-stage differential amplifier including an input stage 24 and an output stage 25. Each stage is referenced to ground, and the aforementioned crossover circuit provides the interstage coupling in the amplifier.

Thus, two n-p-n transistors 23 and 26 comprise the first differential amplifier stage 24 and have their emitter terminals connected through a resistor 27 to a source 28 of negative potential. That source and other similar sources in these drawings are schematically represented by a circled polarity sign at the circuit point to which a terminal of the indicated polarity of a suitable source of direct potential is connected. A terminal of opposite polarity of the same source is connected to ground. The ground reference in this first stage is also connected to the base terminal of transistor 26, while the base electrode of transistor 23 receives the input analog signal, referenced to ground, by way of a series-connected resistor 29 and capacitor 30. The latter resistor is a part of an analog, signal-band-limiting filter not otherwise shown but usually included at the input of delta modulation coders.

Capacitor 30 cooperates with the near-zero input resistance of the first amplifier stage 24 to provide the filtered analog signal differentiation previously mentioned in connection with the FIG. 2 differentiator 11. A positive potential source 31 is coupled directly to a collector terminal of transistor 26, and it is further coupled through a resistor 32 to a collector terminal of transistor 23. A capacitor 33 is connected between collector and base terminals of transistor 23 for providing negative feedback to the amplifier input so that the amplifier functions essentially as an integrating operational amplifier with near-zero input impedance.

In the absence of a slow feedback path signal, an analog signal in path 10 is reproduced on the collector of transistor 23 with a negative gain of $C_{30}/C_{33}$ and low pass filtered by a simple filter that can be characterized by the single time constant $R_{29}C_{30}$. It is advantageous to make the $C_{30}/C_{33}$ ratio between 10 and 50. In the absence of an analog input signal but with a slow, negative feedback delta modulation signal, there appears at the collector of transistor 23 a signal which is the integral of that slow, negative feedback signal provided by way of resistor 47. In the presence of both the analog input signal and negative feedback signal, there appears at the collector of transistor 23 the sum of the integration of the differentiated input signal and the integration of the delta modulation negative feedback signal. That sum is the integrated error signal for the modulator.

Two resistors 17A and 17B are connected in series between the collector of transistor 23 and the negative source 28 to constitute a level shifter for coupling the output of the first differential amplifier stage 24 to the input of the second differential amplifier stage 25. The latter stage includes two n-p-n transistors 36 and 37. Resistor 17B has a resistance which is about twice the resistance of the resistor 17A, and the series circuit point between the two resistors is connected to the base terminal of transistor 36. The parallel resistance of these two resistors is the resistance which is considered in connection with the capacitance of capacitor 22 for fixing the time constant of the crossover circuit.

The second differential amplifier stage transistors 36 and 37 have their emitter terminal connected through a resistor 38 to a negative source 39. The base terminal of transistor 37 is connected to ground, and the collector terminal thereof is connected to the D input of the flip-flop circuit 19. Transistor 37 derives its operating current from connections within that flip-flop circuit in a manner known in the art for controlling the state of the flip-flop in accordance with the conduction level of transistor 37. A positive potential source 40 supplies current to the collector terminal of transistor 36.

Considering the operation of the second differential amplifier stage 25, the transistors 36 and 37 in that stage normally operate in a linear fashion but nonlinear operation is also satisfactory. A positive, analog, integrated, error signal at the base electrode of transistor 36 causes that transistor to conduct and develop a bias across the resistor 38 which reduces conduction in transistor 37 below a predetermined current threshold, i.e., above the voltage threshold, for circuit 19. Consequently, upon the occurrence of a clock pulse, the flip-flop circuit 19 assumes its set condition with the Q output thereof at a relatively high voltage with respect to the $\bar{Q}$ output. Similarly, a low analog error signal permits such low conduction in transistor 36 that transistor 37 is drawn into higher conduction in transistor 36 that transistor 37 is drawn into higher conduction above the threshold for circuit 19. Now the next occurring clock pulse causes the D flip-flop to produce a Q output signal which is at a relatively low voltage with respect to the $\bar{Q}$ output. Thus, amplifier 25 provides the comparator function with respect to the ground reference, and flip-flop 19 digitizes the comparison results.

The $\bar{Q}$ output of flip-flop circuit 19 is the complement of the D flip-flop input voltage and is coupled through the integrator circuit 21 and capacitor 22 to the input of amplifier stage 25. Integrator 21 includes a series path resistor 41 and a shunt path having a capacitor 42. These elements provide the integration function previously considered in connection with the integrator 21 in FIG. 2. That is, the integrating characteristic is evident at the crossover frequency and above; and the filtering part of the characteristic is below that frequency where the output of amplifier 24 dominates conditions at node 34. A resistor 43, which has a resistance that is small compared to the resistance of resistor 41, is included in series with capacitor 42 to reduce high frequency attenuation to compensate for high frequency attenuation in amplifier 25. Such high frequency peaking is known in the art.

As previously described, the Q output of flip-flop circuit 20 provides the slow negative feedback for the coder. That feedback is coupled through series-connected resistors 46 and 47 to the base terminal of transistor 23. A shunt path resistor 48 connects an intermediate series path terminal between resistors 46 and 47 to a negative potential source 49. Resistors 46 and 48 level shift the digital output to include approximately equal positive and negative excursions. Oppositely poled diodes 50 and 51 also connect the same intermediate circuit point to ground in order to limit feedback signal excursion amplitude of either polarity to a potential corresponding to one conducting diode voltage drop and thereby assure equality of positive and negative step commands regardless of possible inaccuracies in the level shifting operation. A voltage source 52 is connected to the Q output of flip-flop 20 through a resistor 44 which has a resistance that is very small compared to the resistances through the slow feedback path to source 49. Source 52 is included in the circuit in order to equalize the rise and fall times of pulses provided by flip-flop circuit 20.

An increasing analog input signal from circuit path 10 produces a negative-going error at terminal 34, and that error is coupled through the second amplifier stage 25 to reset the flip-flop circuit 19 at each clock pulse. This causes an integrated positive voltage signal to be coupled from integrator 21 to the base electrode of transistor 36, where the frequency range involved determines its relative effectiveness as compared to the aforementioned error signal from terminal 34. That is, if the states of circuits 19 and 20 are changed in most sample intervals the fast feedback via capacitor 22 predominates; but if those states change infrequently, the slow feedback through resistor 17A predominates. On the other hand, the relatively low Q output of flip-flop 19 is coupled, after one clock period delay, through the slow feedback path to the base electrode of transistor 23 where it applies a negative-goining step to the integrating circuit for canceling the initial positive-going excursion of the analog input. Negative-going input analog excursions are similarly canceled.

In some applications requiring high speed operation, the amplifier might be expected to need a rather complex design to respond adequately within the range of current swings permitted by the diodes 50 and 51 in the slow feedback path. However, in those cases, the burden of the amplifier design is significantly reduced by a coupling capacitor 35 and a resistor 45 connected in series between the Q̄ output of flip-flop 20 and the collector lead of transistor 23 in amplifier 24. Resistor 45 has a resistance selected to cause flip-flop 20 to supply, or draw, the current needed by feedback capacitor 33 to match the state of the flip-flop at the amplifier input.

In one specific coder constructed and operated in accordance with FIG. 3 for input analog signals band-limited to a spectrum extending from 0 to 6 kHz, circuit component valus were as follows:

| | |
|---|---|
| R17A | 22 kilohms |
| R17B | 47 kilohms |
| R27 | 5.6 kilohms |
| R29 | 1.8 kilohms |
| R32 | 4.7 kilohms |
| R38 | 22 kilohms |
| R41 | 10 kilohms |
| R43 | 82 ohms |
| R44 | 300 ohms |
| R45 | 5.6 kilohms |
| R46 | 1.2 kilohms |
| R48 | 7.2 kilohms |
| R47 | 2 kilohms |
| C22 | 100 picofarads |
| C30 | 0.015 microfarads |
| C33 | 1000 picofarads |
| C35 | 100 picofarads |
| C42 | 620 picofarads |
| Transistors | Texas Instruments type 2N3904 |
| Diodes | Fairchild type FD700 |
| Flip-flops 19 and 20 | Texas Instruments type 74LS74 |
| Source 31 | plus 12 volts |
| Sources 28, 39, and 49 | minus 12 volts |
| Sources 40 and 52 | plus 5 volts |

All resistors and capacitors, except R47 and C30, in the foregoing embodiment are advantageously ±10 percent tolerance elements. The tolerance of R47 and C30 depends upon the tolerance needed in coder insertion gain; and, for example, they have a tolerance of ±5 percent for a tolerance of ±1 db in insertion gain.

In the foregoing specific embodiment the crossover circuit time constant is about 1.5 microseconds, or about ten times the period of the sampling clock from source 14. The crossover frequency is at about 100 kHz. Integrator 21 in the fast feedback has a timer constant of about 6 microseconds, and the stage 24 integrator time constant for the slow feedback is about 5 microseconds. The feedback signal derived by way of resistor 47 constitutes a current swinging between plus and minus 300 microamperes for a circuit without capacitor 35 and resistor 45, with the result that transistor 23 is correspondingly driven between 0.7 and 1.3 milliamperes for its collector-emitter current.

The delta modulation input to the integrator 21 in the fast feedback path is of poor quality because the output voltage levels of flip-flop 19 are poorly defined, and the output pulses include pulse width modulation, both because of triggering signals with amplitudes near the decision threshold of the flip-flop as already explained. In the foregoing specific embodient, the integrator 21 begins to act as an integrator at about 26 kHz; and above 100 kHz it provides the dominant, substantially linearly (on a log—log scale) decreasing gain with increasing frequency, integration function for the coder at node 34. The latter characteristic extends out at least through the coder sampling frequency and peferably beyond as hereinbefore described.

Correspondingly, the output of the integrator including the first amplifier stage 24 has an essentially linearly (on a log-log scale) decreasing gain with increasing frequency characteristics for all low frequencies of interest and up to approximately 200 kHz; and up through about 100 kHz that output dominates the signal condition at node 34. Thus, the output of the stage 24 integrator, which is slow but precise, is combined with the output of the integrator 21, which is fast but imprecise, in the crossover circuit which couples the two amplifier stages and the output of the fast feedback path. The frequency response at the output of the crossover circuit is linear over the full range of frequencies of interest. Consequently, errors in the imprecise fast feedback loop are eliminated in approximately 1.5 microseconds by the effects of the precise feedback loop.

Overall, the coder of FIG. 3 is inexpensive because it requires impedance elements in a relatively simple configuration and with only relatively large tolerances on impedance values as compared to adaptive delta modulators known in the art. The coder is stable and presents substantially uniform insertion gain in a system. Sampling rate and response of the coder are such that it responds readily to both slow and rapid voice and video signal variations without the need for the complexities of companding or adaptive coding techniques.

Figure 4:
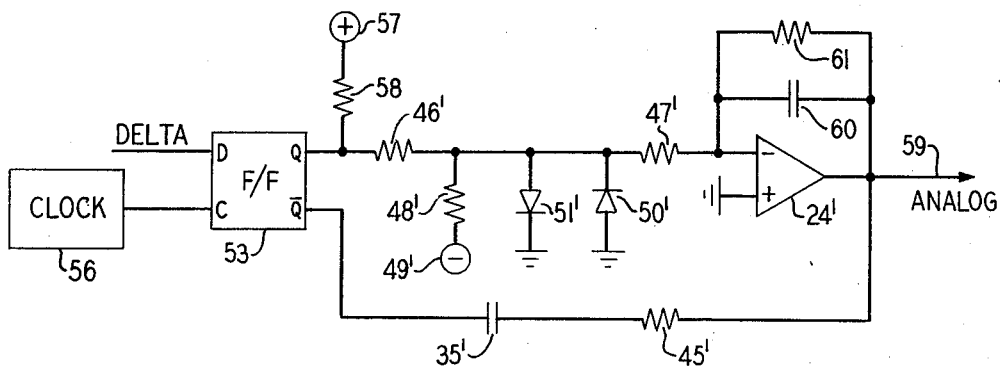
FIG. 4 is a schematic diagram of a decoder which is compatible with the coder of FIGS. 2 and 3.

FIG. 4 is a schematic diagram of the decoder 9 for use in conjunction with the coder of FIG. 3. In FIG. 4 the delta modulation signal is provided on an input circuit from the digital transmission path to the D input of a further D-type flip-flop circuit 53. This flip-flop circuit is provided with clock signals from a clock source 56 which is synchronized with the incoming delta modulation pulse train by circuits, not shown, which can be any convenient one of the synchronizing circuits known in the art. A positive potential source 57 and a resistor 58 are coupled to the Q output of flip-flop 53 for equalizing output signal transition times in the manner previously noted for the flip-flop circuit 20 in FIG. 3. Q and Q̄ outputs of flip-flop circuit 53 provide true and complement forms of the delta modulation signal.

Two signal paths are provided for coupling the Q and Q̄ outputs of flip-flop circuit 53 to an analog signal output circuit 59. A first path corresponds to the slow but precise feedback path of the coder and includes similarly designated circuit elements. Thus, two series-connected resistors 46' and 47' couple the Q output of flip-flop 53 to the inverting input of an operational amplifier 24'. The noninverting input of the amplifier is connected to ground. A resistor 48' couples the circuit junction between resistors 46' and 47' to a negative potential source 49', and the same intermediate terminal is coupled to ground by oppositely poled diodes 51' and 50'. A negative feedback circuit for the amplifier 24' includes a capacitor 60 and a parallel-connected leakage resistor 61. Capacitance of this capacitor 60 is essentially the same as the capacitance of the input capacitor 30 in the coder, and is thus much larger than the feedback capacitor 33 used in the coder. The combination of amplifier 24' and capacitor 60 provides the slow path integrating function for the decoder.

The Q̄ output of flip-flop circuit 53 is coupled by way of a series-connectd capacitor 35' and a resistor 45' to the decoder output circuit 59. Resistance of resistor 45' is chosen to yield an impedance and a time constant, in conjunction with capacitor 35', which allows the Q̄ output of flip-flop circuit 53 to absorb current from, or supply current to he eedback path of amplifier 24' during analog signal transitions. This arrangement relieves some of the operational burden from the amplifier 24' so that it can be of much less complex design than would otherwise be required to respond to the analog signal stepping commands of flip-flop circuit 53.

In one decoder constructed for operation in conjunction with the previously described coder embodiment, circuit element values were as follows:

| | |
|---|---|
| R46' | 1.2 kilohms |
| R47' | 2 kilohms |
| R48' | 7.6 kilohms |
| R58 | 300 ohms |
| R61 | 68 kilohms |
| R45' | 5.6 kilohms |
| C35' | 100 picofarads |
| C60 | 0.015 microfarads |
| Bistable circuit 53 | Texas Instruments type 74LS74 |
| Amplifier 24' | Fairchild type 747 |

Tolerances on resistor and capacitor values are ±10 percent as before except that resistor R45' and capacitor 60 have ±5 percent tolerance for ±1 db tolerance on insertion gain.

Although the present invention has been described in connection with a particular embodiment thereof, it is to be understood that additional embodiments and modifications which will be obvious to those skilled in the art are included within the spirit and scope of the invention.

What is claimed is:

1. In a delta modulation system, a coder for converting analog input signals in a predetermined frequency range into a delta modulation signal pulse train representing those analog signals, said coder comprising
   means for producing an analog error signal which is indicative of the difference between the information content of the input analog signal in a present sampling time and the information content of a delta modulation representation of that analog signal in an immediately prior sampling time,
   means for indicating, in digital form, the error signal level with respect to a predetermined threshold reference in each of plural digital sampling times, said indicating means output error signal having pulse width modulation if it is actuated by an input signal level which is close to the level of said threshold reference,
   means for retiming said digital error signal to eliminate said pulse width modulation, the retimed signal being said pulse train,
   first means, having an analog integrating characteristic, for coupling the indicating means output to the input of said indicating means,
   said coupling means including means for blocking application of direct current through such coupling means between output and input of such indicating means, and
   second means for coupling an output of said retiming means to an input of said producing means.

2. The delta modulation system in accordance with claim 1 which includes in addition a delta decoder connected to receive said retimed signal and comprising
   means, responsive to said retimed signal, for producing true and complement forms of such signal,
   an integrating operational amplifier,
   means for coupling said true form of said retimed signal to an input of said operational amplifier, and
   means for coupling said complement form of said retimed signal to an output of said amplifier to supply current required there for each change of state of said retimed signal.

3. The coder in the system of claim 1 in which means are provided at the input of said indicating means for combining outputs of said first coupling means and of said producing means so that first and second signal paths by way of said first and second coupling means, respectively, have integrating gain-versus-frequency response characteristics over substantially different parts of a frequency band of interest which includes said frequency range but both of said frequency band parts include at least one common crossover frequency, the gain from said indicating means output to said indicating means input being substantially the same through both of said first and second paths at said crossover frequency.

4. The coder in accordance with claim in which said combining means includes
   resistive and reactive impedances interconnected to appear from the output of said first coupling means as a high-pass filter and to appear from the output of said producing means as a low-pass filter.

5. The coder in accordance with claim 3 in which said first coupling means comprises a resistor connected in series in said first path and a capacitor conncted in shunt across said first path to form an analog integrating circuit, and said combining means comprises a capacitor connected for coupling said resistor to the input of said indicating means.

6. The combination in accordance with claim 5 in which there is connected in series with said shunt capacitor, and in the shunt across said first path, resistance means having a resistance selected for optimum stability condition in said amplifier and feedback paths.

7. The coder in accordance with claim 3 in which
said second coupling means comprises a level shifting circuit and a bipolar clipping circuit cooperating to force the digital error signal from the output of said retiming means into a bipolar configuration having substantially equal positive and negative excursions with respect to ground, and
said producing means comprises
a coder forward path integrating means having an input and an output,
means for resistively coupling an output of said clipping means to said integrating means input, and
differentiating means connected for coupling said analog input signals to said integrating means input.

8. The coder in accordance with claim 1 which comprises in addition
means for coupling a signal from an output of said retiming means to an output of said producing means and including in series
a coupling capacitor, and
a resistor having a resistance selected so that substantially all current required at said producing means output by a change in state of said retiming means output is supplied by said retiming output signal coupling means.

9. The delta modulation system coder in accordance with claim 1 in which
said first coupling means includes means for establishing therein an integrating gain-versus-frequency characteristic including a predetermined crossover frequency and a higher frequency of approximately three times the recurrence frequency of said sampling times, and
said second coupling means and said producing means include means for establishing therein an integrating gain-versus-frequency characeristic including direct current and said crossover frequency.

10. In combination,
an amplifier for analog signals in a predetermined frequency band of interest, said amplifier including a first stage and a second stage,
first means for integrating analog signals and having an integration response in the high frequency portion of the band of interest,
first means for coupling an output of said amplifier to said first integrating means,
second means for integrating signals at an input to said amplifier and having an integration response in at least a low frequency portion of said band of interest,
second means for coupling the output of said amplifier to the input thereof, and
said amplifier including a frequency crossover coupling circuit connected for coupling an output of said first stage to an input of said second stage and for coupling the output of the first integrating means to the same input of the second stage, said crossover network having a crossover frequency which is common to said high and low frequency portions.

11. The combination in accordance with claim 10 in which
each of said first and second stages is a differential amplifier, and
each of said differential amplifiers has a first input for analog signals and a second input connected to a ground reference.

12. The combination in accordance with claim 10 in which
said means for coupling said amplifier output to said first integrating means comprises a first bistable trigger circuit having its input connected to the output of said amplifier and having an inverted output connected to the input of said first integrating means, and
said means for coupling said amplifier output to said first stage input comprises a second bistable trigger circuit having its input connected to a noninverting output of said first bistable circuit and having an uninverted output connected to the input of said first stage.

13. The combination in accordance with claim 10 in which
said first stage comprises a differential amplifier including first and second transistors and common emitter impedance,
means for receiving an analog signal with respect to ground are coupled across a base terminal of said first transistor and said impedance,
a ground reference is connected to a base terminal of said second transistor, and
said crossover circuit comprises resistance means connected to provide said coupling from said first stage output to said second stage input, said resistance means comprising a resistive level shifter connected across a collector terminal of said first transistor and said common emitter impedance, and means for connecting an intermediate terminal of said level shifter to the input of said second stage, and
capacitance means connected between the output of said first integrating means and said input of said second stage.

14. The combination in accordance with claim 10 in which
said coupling means for the output of said amplifier are clocked at a rate in said high frequency portion for sampling the output of said amplifier, and
said crossover circuit has a time constant which is much less than said first integrating means time constant but much larger than the period of said sampling.

15. In a delta modulation system, a decoder comprising
a bistable trigger circuit for receiving delta modulated digital signals, said trigger circuit having first and second complementary outputs,
an operational amplifier having an inverting input connected to receive signals from said first output of said trigger circuit,
a capacitive feedback circuit connected between an output and said inverting input of said operational amplifier, and
a feed forward circuit coupled between said second output of said bistable circuit and said output of said operational amplifier.

16. A circuit for converting a delta modulation signal to an analog signal, said circuit comprising
   means for producing true and complement forms of a delta modulation signal,
   means for differentially amplifying, with respect to ground, signals applied to an input of said amplifying means,
   means for coupling said true form of said delta modulation signals to said amplifying means input, and
   means for coupling said complement form of said delta modulation signals to an output of said amplifying means.

17. The circuit in accordance with claim 16 in which said amplifying means includes means for integrating signals appearing at said amplifying means input.

18. The circuit in accordance with claim 16 in which said true coupling means comprises
   means for level shifting said true signal form to have substantially equal positive and negative excursions with espect to ground, and
   means for limiting said excursions to predetermined positive and negative levels and resistance means for coupling the output of said limiting means to said amplifying means input, and
   said complement signal form coupling means comprises
   a coupling capacitor, and
   resistance means connected in series with said coupling capacitor for applying said complement signal form to said amplifier output, said resistance means having a resistance selected so that substantially all current required at said amplifier output by a change in state of said delta modulation signal is supplied by said producing means.

19. The circuit in accordance with claim 16 in which said amplifying means includes means for integrating signals at said amplifying means input, and
   there are also provided in combination with said converting circuit, for encoding analog signals,
   second means for amplifying signals,
   a first bistable trigger circuit in said producing means,
   an integrating circuit connected to receive said complement form signal from an output of said first bistable circuit,
   a frequency crossover impedance circuit connecting said output of the first mentioned amplifying means to an input of said second amplifying means and connecting an output of said integrating circuit to said input of said second amplifying means, and
   a second bistable trigger circuit in said true form coupling means, an output of the latter trigger circuit being a delta modulation signal representation of said signals at said input to said first amplifying means.

* * * * *